(12) United States Patent
Govoni et al.

(10) Patent No.: US 11,394,471 B1
(45) Date of Patent: Jul. 19, 2022

(54) HIGH-POWER RADIO FREQUENCY (RF) POWER DETECTOR

(71) Applicant: U.S. Army Combat Capabilities Development Command, Army Research Laboratory, Adelphi, MD (US)

(72) Inventors: Mark A. Govoni, Abingdon, MD (US); John T. Clark, Elkridge, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/210,552

(22) Filed: Mar. 24, 2021

(51) Int. Cl.
*H03G 3/30* (2006.01)
*H04B 17/00* (2015.01)
*H04B 1/06* (2006.01)
*H03F 1/32* (2006.01)
*H03F 3/189* (2006.01)
*H04B 17/10* (2015.01)
*H01L 23/66* (2006.01)
*G01R 21/00* (2006.01)
*H03H 7/25* (2006.01)
*H01L 29/16* (2006.01)

(52) U.S. Cl.
CPC ........... *H04B 17/101* (2015.01); *G01R 21/00* (2013.01); *H01L 23/66* (2013.01); *H01L 29/1602* (2013.01); *H03H 7/25* (2013.01)

(58) Field of Classification Search
None
See application file for complete search history.

(56) References Cited

U.S. PATENT DOCUMENTS

| | | | | |
|---|---|---|---|---|
| 5,457,811 A | * | 10/1995 | Lemson | H03G 3/3052 455/249.1 |
| 5,646,578 A | * | 7/1997 | Loh | H03G 3/3047 330/279 |
| 5,982,630 A | * | 11/1999 | Bhatia | H05K 1/0207 361/767 |
| 5,995,853 A | * | 11/1999 | Park | H03G 3/3042 455/574 |
| 6,484,017 B1 | * | 11/2002 | Kim | H04B 1/04 455/115.3 |
| 6,798,287 B2 | * | 9/2004 | Wu | H03G 3/3042 330/129 |
| 7,256,664 B1 | * | 8/2007 | Blacka | H01P 1/227 333/81 R |

(Continued)

OTHER PUBLICATIONS

"Analog Devices Welcomes Hittite Microwave Corporation"; Hittite Microwave Products From Analog Devices; Downloaded from www.analog.com / www.hittite.com; 12 pages.

(Continued)

*Primary Examiner* — Tuan A Tran
(74) *Attorney, Agent, or Firm* — Alan I. Kalb

(57) ABSTRACT

A method and apparatus for detecting RF power comprising an input port configured to receive a high-power RF signal, at least one diamond chip attenuator, coupled to the input port, configured to attenuate the high-power RF signal, and an RF detector integrated circuit, coupled to the at least one diamond chip attenuator, configured to convert the attenuated RF signal into an output indicium representing a power level of the high-powered RF signal.

13 Claims, 2 Drawing Sheets

(56) References Cited

U.S. PATENT DOCUMENTS

| | | | | |
|---|---|---|---|---|
| 8,310,304 | B1* | 11/2012 | Vagher | H03G 3/3042 |
| | | | | 330/136 |
| 8,521,114 | B2* | 8/2013 | Carugati | H03G 3/3052 |
| | | | | 455/240.1 |
| 8,929,843 | B2* | 1/2015 | Akula | H03G 3/3042 |
| | | | | 330/207 P |
| 8,983,416 | B1* | 3/2015 | Spencer | H04B 1/16 |
| | | | | 455/249.1 |
| 9,077,405 | B2* | 7/2015 | Jones | H04B 1/0458 |
| 9,136,883 | B1* | 9/2015 | Moher | H04B 1/0475 |
| 9,444,411 | B2* | 9/2016 | Scott | H03F 3/213 |
| 9,614,277 | B2* | 4/2017 | Van Zeijl | H01Q 1/42 |
| 9,722,492 | B2* | 8/2017 | Levesque | H03F 3/602 |
| 9,748,912 | B2* | 8/2017 | Choi | H03F 3/19 |
| 9,985,601 | B2* | 5/2018 | Wang | H03H 7/25 |
| 10,666,327 | B2* | 5/2020 | Son | H04B 17/14 |
| 11,218,123 | B2* | 1/2022 | Jordanger | H03F 3/45475 |
| 2011/0014886 | A1* | 1/2011 | Manssen | H01Q 1/242 |
| | | | | 455/121 |
| 2014/0084987 | A1* | 3/2014 | Beale | G06G 7/164 |
| | | | | 327/349 |
| 2016/0105299 | A1* | 4/2016 | Chee | H04B 1/40 |
| | | | | 375/297 |
| 2019/0280665 | A1* | 9/2019 | Nonomura | H04B 1/16 |

OTHER PUBLICATIONS

"Microwave Components Catalog"; EMC Technology/ Florida RF Labs; 112 pages (relevant pp. 65-67).

\* cited by examiner

HIGH-POWER RADIO FREQUENCY (RF) POWER DETECTOR

GOVERNMENT INTEREST

The invention described herein may be manufactured, used and licensed by or for the U.S. Government.

BACKGROUND

Field

Embodiments of the present invention generally relate to the radio frequency (RF) signal power detection and, more specifically, to a high-power RF power detector.

Description of the Related Art

Current electronics for handling radio frequency (RF) signals using surface mount technology are rated at low operational frequencies and/or low power levels. Such RF electronics find use in personal communications devices and other low power RF circuitry. Recently, the Federal Communications Commission (FCC), and other government agencies around the world, have reallocated use of higher frequency bands to the cellular communications market. These higher frequencies result in increased transmission losses between a cellular tower and a handheld transceiver. Consequently, increased power levels are being used. Meanwhile, the size, weight and power (SWAP) constraints are being maintained and, in some instances, even decreased.

More specifically, current printed circuit board-based (PCB-based) RF detectors can only tolerate input power levels on the order of 20 dBm (100 mW) and are used primarily in lower frequency bands, e.g., 3G and 4G bands ranging from 700 MHz to 2.5 GHz; while the latest 5G cellular band operates in the 25-39 GHz range. Other, non-cellular, PCB-based RF detector applications can require operation at power levels of up to +60 dBm (1 kW) and at frequencies in the 8-12 GHz range (aka "the X band").

Therefore, there is a need in the art for an RF signal power detector that is PCB-based and can tolerate both high frequencies and high-power levels.

SUMMARY

Embodiments of the present invention include an RF detector that is implemented on a PCB configured to operate at both high frequencies and high input power levels. In one embodiment, the RF detector comprises a PCB supporting at least one diamond chip attenuator coupled to a surface mount RF power detector integrated circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention include an RF detector circuit that is implemented on a PCB configured to operate at both high frequencies and high input power levels. In one embodiment, the circuit, implemented on a PCB, comprises at least one diamond chip attenuator (DCA) coupled to an optional PCB attenuator followed by a surface mount RF detector integrated circuit. The RF detector outputs a DC voltage proportional to the RF input power received by the DCA.

Figure 1:
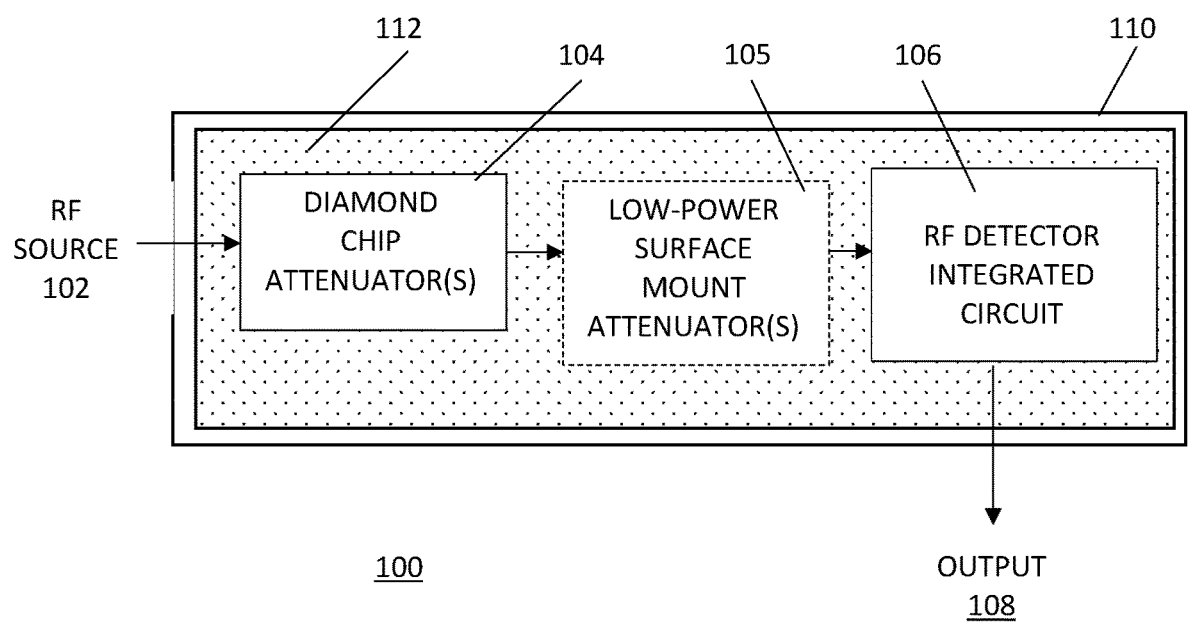
FIG. 1 depicts a block diagram of a PCB in accordance with an embodiment of the present invention.

FIG. 1 depicts a block diagram of an RF detector circuit 100 formed on a PCB in accordance with an embodiment of the present invention. The RF detector circuit, 100 comprises an input port 102, at least one diamond chip attenuator 104, at least one optional low power attenuator 105 (shown as a dashed box to indicate the optional nature of this component), an RF detector integrated circuit 106 and an output header 108. In one embodiment, the peripheral components (bias capacitors, inductors, etc.) of the RF detector circuit 100 are supported upon, and generally attached to, a printed circuit board (PCB) 110 (i.e., the attenuator 104 and circuit 106 are surface mounted [e.g., soldered] to the PCB 110). The PCB 110 contains plated through holes (aka "vias") to connect portions of the top side of the PCB to the bottom side. The PCB may include a ground plane 112 on at least a portion of the PCB 110. In one embodiment, the ground plane 112 may cover the entire bottom of the PCB 112. The RF detector circuit 100 is configured to detect high-power, high frequency RF signals. High-power is defined as RF signals having power levels equivalent to 20 watts of continuous wave (CW) power as this is the rated power of the DCA chip. Higher level detection is possible through use of a higher power rated DCA; such as a DCA that is adequately heat-sinked. Some embodiments are designed to detect such RF signals in multi-channel, broadband situations. The term RF signal is meant to include any radio frequency signal in spectrums such as ULF, UHF, VHF, millimeter wave, microwave, and the like. In one particular embodiment, the RF detector circuit 100 operates in a frequency range from 1 GHz to 10 GHz and, in a more specific embodiment, the RF detector circuit operates in a range of 8 GHz to 10 GHz.

The RF detector circuit 100 is configured to be connected, via the input port (e.g., a RF connector), to an RF source such as an, antenna, bench RF power source, RF signal transmitter, and the like. In one embodiment, the RF input signal level has a peak power of at least 200 watts and, in other embodiments, the RF signal may have a peak power of about 1000 watts for a short duration (i.e., a few milliseconds). This high-power input signal must be attenuated to enable the RF detector integrated circuit 106 to be able to receive and process the signal without failure. Most surface mount attenuators cannot handle signal levels in excess of 2 W.

Diamond is an extremely good heat conductor. As such, diamond has been used to fabricate Diamond Chip Attenuators (DCAs) that utilize the superior heat conduction properties of diamond to create high-power attenuators. One such exemplary DCA is available from EMC Technology as the model CA0505D. This DCA is surface mountable to a PCB, operates at a wide frequency range (e.g., DC to 26.5 GHz) and can provide fixed attenuation levels ranging from 1 through 30 dB of attenuation for signal levels up to 20 watts of continuous power. The DCA has a very small footprint (e.g., 1.4 mm by 1.4 mm). The model CA0505D FT includes heat sink flanges coupled to the DCA, where the flanges are mountable to a PCB to provide additional heat removal capabilities using a very small footprint (e.g., 12.7 mm by 5.03 mm). When equipped with the aforementioned heat sink flange, empirical data verified no damage occurs to the DCA at CW RF inputs levels of 200 W.

The RF detector 106, in a standalone implementation, handles about +20 dBm of signal without failure. Thus, to create an RF detector circuit 100 that is able to handle +60 dBm, the DCA 104 must create at least 40 dB of attenuation. In one exemplary embodiment, two serially connected 20 dB attenuators (one DCA and one standard surface mount attenuator) are used. The DCA is implemented on the above mentioned flange which is connected to the ground plane 112 of the PCB 110 to provide additional heat sinking.

In one embodiment, the RF detector integrated circuit 106 may be a model HMC611LPE logarithmic detector available from Analog Devices Inc. This detector circuit operates from 1 MHz to 10 GHz and produces an output voltage that is substantially linear with input RF power (i.e., the conversion slope is, for example, −32 mV/dBm). The linear operating range is about −40 to +10 dBm and the detector circuit is not damaged with power levels exceeding +19 dBm. This circuit has a very small footprint of about 4 mm by 4 mm; excluding required peripheral electronic components. The RF detector circuit 100 may operate at frequencies above 10 GHz through selection of a different model of RF detector integrated circuit 106.

In one exemplary embodiment, the DCA applies 40 dB of attenuation and the RF detector integrated circuit can detect input signals exceeding +19 dBm. Such an RF detector 100 can handle input power levels of nearly +60 dBm at frequencies as high as 10 GHz and have a very small size (i.e., meeting the SWAP constraints of handheld communications devices).

Figure 2:
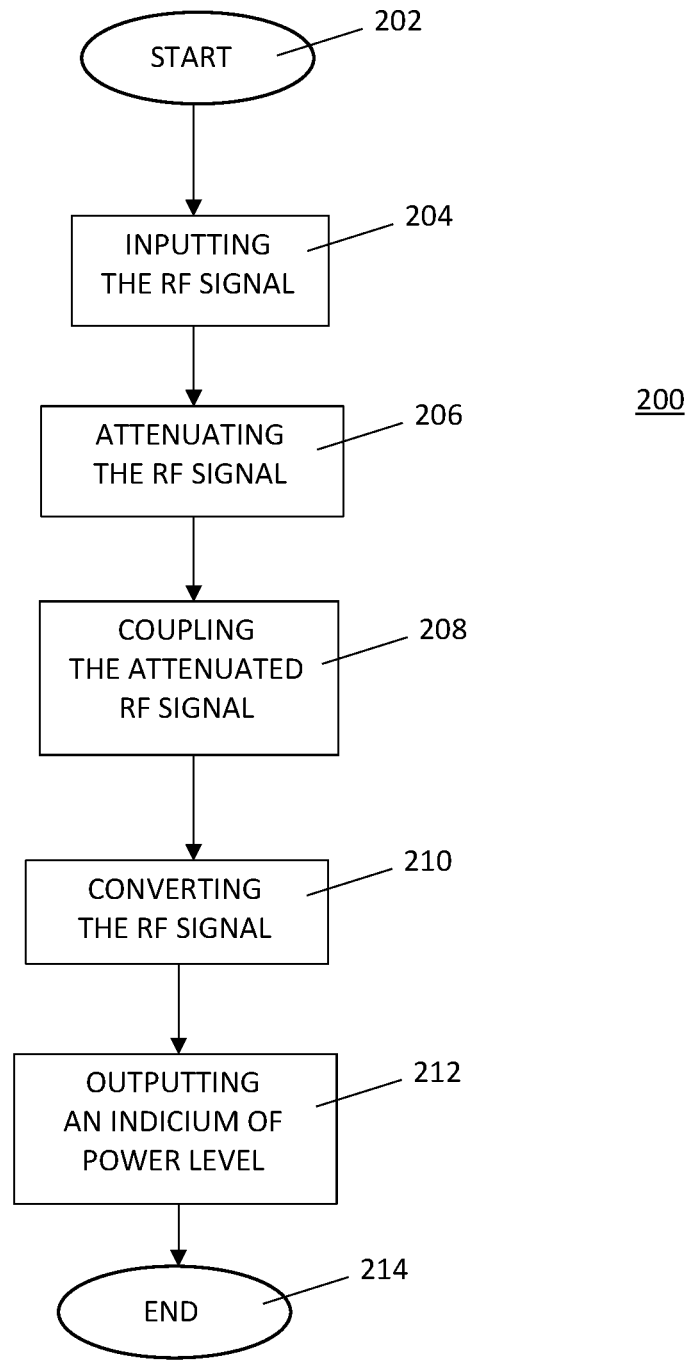
FIG. 2 depicts a flow diagram of a method of operation for the PCB in FIG. 1 in accordance with an embodiment of the present invention.

FIG. 2 depicts a flow diagram of a method 200 of operation for the RF detector circuit 100 of FIG. 1 in accordance with an embodiment of the invention. The operating method begins at 202 and proceeds to 204, where a high-power RF signal is coupled to the input port (i.e., inputting an RF signal that is to be measured by the RF detector circuit 100). At 206, the at least one attenuator attenuates the high-power RF signal to a level that is compatible with the RF detector integrated circuit. The attenuated signal, at 208, is coupled to the RF detector integrated circuit and, at 210, the RF detector integrated circuit converts the attenuated RF signal into a voltage (e.g., a DC voltage or a digital signal representing a DC voltage) that represents the amount of power in the attenuated RF signal. At 212, the RF detector integrated circuit outputs the voltage. Since the at least one attenuator attenuates the RF signal in a substantially linear manner, the output voltage of the detector forms an indicium of power level of the received high-power RF signal. The method 200 ends at 214.

Embodiments of the present invention may find use as RF detectors in cell tower power monitoring devices, radar detectors, Wi-Fi detectors, RF energy leakage detectors (sniffer probes), electronic warfare devices, and/or any other application requiring RF power detection.

Here multiple examples have been given to illustrate various features and are not intended to be so limiting. Any one or more of the features may not be limited to the particular examples presented herein, regardless of any order, combination, or connections described. In fact, it should be understood that any combination of the features and/or elements described by way of example above are contemplated, including any variation or modification which is not enumerated, but capable of achieving the same. Unless otherwise stated, any one or more of the features may be combined in any order.

As above, figures are presented herein for illustrative purposes and are not meant to impose any structural limitations, unless otherwise specified. Various modifications to any of the structures shown in the figures are contemplated to be within the scope of the invention presented herein. The invention is not intended to be limited to any scope of claim language.

Where "coupling" or "connection" is used, unless otherwise specified, no limitation is implied that the coupling or connection be restricted to a physical coupling or connection and, instead, should be read to include communicative couplings, including wireless transmissions and protocols.

Any block, step, module, or otherwise described herein may represent one or more instructions which can be stored on a non-transitory computer readable media as software and/or performed by hardware. Any such block, module, step, or otherwise can be performed by various software and/or hardware combinations in a manner which may be automated, including the use of specialized hardware designed to achieve such a purpose. As above, any number of blocks, steps, or modules may be performed in any order or not at all, including substantially simultaneously, i.e., within tolerances of the systems executing the block, step, or module.

Where conditional language is used, including, but not limited to, "can," "could," "may" or "might," it should be understood that the associated features or elements are not required. As such, where conditional language is used, the elements and/or features should be understood as being optionally present in at least some examples, and not necessarily conditioned upon anything, unless otherwise specified.

Where lists are enumerated in the alternative or conjunctive (e.g., one or more of A, B, and/or C), unless stated otherwise, it is understood to include one or more of each element, including any one or more combinations of any number of the enumerated elements (e.g., A, AB, AC, ABC, ABB, etc.). When "and/or" is used, it should be understood that the elements may be joined in the alternative or conjunctive.

While the foregoing is directed to embodiments of the present invention, other and further embodiments of the invention may be devised without departing from the basic scope thereof, and the scope thereof is determined by the claims that follow.

The invention claimed is:

1. Apparatus for detecting RF power comprising: an input port configured to receive a high-power RF signal; at least one diamond chip attenuator, coupled to the input port, configured to attenuate the high-power RF signal; and an RF detector integrated circuit, coupled to the at least one diamond chip attenuator, configured to convert the attenuated RF signal into an output indicium representing a power level of the high-powered RF signal, wherein at least one low power attenuator, coupled in series with the at least one diamond chip attenuator, configured to further attenuate the attenuated RF signal.

2. The apparatus of claim 1 further comprising a printed circuit board upon which the at least one diamond chip attenuator and RF detector integrated circuit are mounted.

3. The apparatus of claim 2, wherein the printed circuit board comprises a ground plane that forms a heat sink for the at least one diamond chip attenuator.

4. The apparatus of claim 1, wherein the high-power RF signal is at least 20 watts and the at least one diamond chip attenuator applies at least 20 dB of attenuation to the high-power RF signal.

5. The apparatus of claim 1, wherein the high-power RF signal has a frequency between 1 GHz and 10 GHz.

6. A method of operation of a high-power RF power detector circuit comprising: coupling a high-power RF signal to an input port of the high-power RF detector circuit; attenuating the high-power RF signal using at least one diamond chip attenuator to create an attenuated RF signal; converting the attenuated RF signal using an RF detector integrated circuit into an indicium of power level of the high-power signal; and outputting the indicia of power level, wherein at least one low power attenuator that is coupled in series with the diamond chip attenuator so as to further attenuate the attenuated RF signal.

7. The method of claim 6, wherein the at least one diamond chip attenuator and RF detector integrated circuit are mounted upon a printed circuit board.

8. The method of claim 7, wherein the printed circuit board comprises a ground plane that forms a heat sink for the at least one diamond chip attenuator.

9. The method of claim 6, wherein the high-power RF signal is at least 20 watts and the at least one diamond chip attenuator applies at least 20 dB of attenuation to the high-power RF signal.

10. The method of claim 6, wherein the high-power RF signal has a frequency between 1 GHz and 10 GHz.

11. An RF power detector circuit comprising: an input port configured to receive a high-power RF signal; a diamond chip attenuator, coupled to the input port, configured to attenuate the high-power RF signal; an RF detector integrated circuit, coupled to the diamond chip attenuator, configured to convert the attenuated RF signal into an output indicium representing a power level of the high-powered RF signal; a printed circuit board upon which the pair of diamond chip attenuators and RF detector integrated circuit are mounted and wherein the printed circuit board comprises a ground plane that forms a heat sink for the pair of diamond chip attenuators, wherein a low power attenuator, coupled in series with the diamond chip attenuator, configured to further attenuate the attenuated RF signal.

12. The RF detector circuit of claim 11, wherein the high-power RF signal is at least 20 watts and the at least one diamond chip attenuator applies at least 20 dB of attenuation to the high-power RF signal.

13. The RF detector circuit of claim 11, wherein the high-power RF signal has a frequency between 1 GHz and 10 GHz.

* * * * *